(12) United States Patent
Lin

(10) Patent No.: US 10,978,532 B2
(45) Date of Patent: Apr. 13, 2021

(54) ORGANIC LIGHT-EMITTING DIODE (OLED) DISPLAY PANEL AND METHOD THEREOF

(71) Applicant: Shenzhen China Star Optoelectronics Semiconductor Display Technology Co., Ltd., Guangdong (CN)

(72) Inventor: Bifen Lin, Guangdong (CN)

(73) Assignee: Shenzhen China Star Optoelectronics Semiconductor Display Technology Co., Ltd., Guangdong (CN)

( * ) Notice: Subject to any disclaimer, the term of this patent is extended or adjusted under 35 U.S.C. 154(b) by 32 days.

(21) Appl. No.: 16/497,953

(22) PCT Filed: May 8, 2019

(86) PCT No.: PCT/CN2019/085942
§ 371 (c)(1),
(2) Date: Sep. 26, 2019

(87) PCT Pub. No.: WO2020/206780
PCT Pub. Date: Oct. 15, 2020

(65) Prior Publication Data
US 2021/0013279 A1 Jan. 14, 2021

(30) Foreign Application Priority Data
Apr. 9, 2019 (CN) .......................... 201910279671.9

(51) Int. Cl.
*H01L 27/32* (2006.01)
*H01L 51/52* (2006.01)
*H01L 51/56* (2006.01)

(52) U.S. Cl.
CPC ...... *H01L 27/3262* (2013.01); *H01L 27/3246* (2013.01); *H01L 27/3258* (2013.01); *H01L 51/5218* (2013.01); *H01L 51/56* (2013.01)

(58) Field of Classification Search
None
See application file for complete search history.

(56) References Cited

U.S. PATENT DOCUMENTS

2009/0026935 A1* 1/2009 Matsunami ......... H01L 51/0061
313/504
2009/0203285 A1* 8/2009 Kobayashi .......... H01L 27/3211
445/58

(Continued)

FOREIGN PATENT DOCUMENTS

CN 105470282 A 4/2016
CN 106647031 A 5/2017

(Continued)

*Primary Examiner* — Hsien Ming Lee
(74) *Attorney, Agent, or Firm* — Mark M. Friedman

(57) ABSTRACT

Disclosed is an organic light-emitting diode (OLED) display panel which comprises a thin-film transistor (TFT) device layer and a light-emitting layer disposed on the thin-film transistor device layer. A reflection-enhancing layer provided between the thin-film transistor device layer and the light-emitting layer includes an insulating layer disposed on the thin-film transistor device layer, a plurality of reflecting electrodes disposed on the insulating layer in a matrix manner and corresponding one-to-one to each emitting area of the organic light-emitting diode display panel, and a planarization layer disposed on the insulating layer and covering the plurality of reflecting electrodes. A plurality of anodes of the light-emitting layer are disposed on the planarization layer, and the plurality of anodes of the light-emitting layer are positioned opposite to the plurality of reflecting electrodes.

8 Claims, 3 Drawing Sheets

(56) References Cited

U.S. PATENT DOCUMENTS

2010/0214245 A1* 8/2010 Hi Rota ................ G06F 3/0412
                                                                        345/173
2018/0180252 A1   6/2018 Fu et al.
2019/0198816 A1* 6/2019 Park ................... G02B 27/0176

FOREIGN PATENT DOCUMENTS

| CN | 107507853 A | 12/2017 |
| CN | 107658327 A | 2/2018 |
| JP | 2005062400 A | 3/2005 |

* cited by examiner

ORGANIC LIGHT-EMITTING DIODE (OLED) DISPLAY PANEL AND METHOD THEREOF

FIELD OF INVENTION

The present invention relates to the field of display technologies, and in particular, to an OLED display device and method thereof.

BACKGROUND OF INVENTION

Display devices, such as liquid crystal display (LCD), active matrix-organic light emitting diode (AMOLED), and etc., mainly display an image by controlling light transmittance of liquid crystal using electric field or by controlling light emission of organic light-emitting material using electric current.

Currently, in most processes of top-emitting AMOLED devices, a combination of silver and indium tin oxide is used as reflecting anodes. However, silver protrusions are prone to be formed during the process of manufacturing silver film layer by physical vapor deposition process resulting in short-circuiting of anodes and cathodes, thereby occurring dark spots. If other materials for reflecting anodes are used, the reflectivity obtained will be low or specific equipment will be needed for the manufacturing.

In summary, in the process of manufacturing OLED display panels in the prior art, silver protrusions are prone to be formed since anodes are manufactured by using materials of silver and indium tin oxide resulting in short circuiting of anodes and cathodes, forming dark spots, and low reflectance of other anode materials. Therefore, it is necessary to provide a new OLED display panel to improve this defect.

SUMMARY OF INVENTION

The present invention provides an organic light-emitting diode (OLED) display panel for solving the technical problems in the process of OLED display panels in the prior art, including silver protrusions prone to be formed due to anodes being manufactured by using materials of silver and indium tin oxide resulting in short circuits of anodes and cathodes, forming dark spots, and low reflectance of other anode materials.

In order to solve the above issues, the present invention provides an organic light-emitting diode (OLED) display panel, comprising a thin-film transistor (TFT) device layer and a light-emitting layer disposed on the thin-film transistor device layer, and a reflection-enhancing layer being provided between the thin-film transistor device layer and the light-emitting layer, the reflection-enhancing layer including:

an insulating layer disposed on the TFT device layer;

a plurality of reflecting electrodes disposed on the insulating layer in a matrix manner and corresponding one-to-one to each emitting area of the OLED display panel; and a planarization layer disposed on the insulating layer and covering the plurality of reflecting electrodes;

wherein a plurality of anodes of the light-emitting layer are disposed on the planarization layer in a matrix manner, and the plurality of anodes of the light-emitting layer are positioned opposite to the plurality of reflecting electrodes.

In the OLED display panel provided by an embodiment of the present application, the light-emitting layer further includes a pixel defining layer, a plurality of light-emitting material layers, and a plurality of cathodes. The pixel defining layer is disposed on the planarization layer and is formed with a plurality of pixel-disposition regions arranged in a matrix manner. The light-emitting material layers are disposed at the plurality of pixel-disposition regions, respectively and are connected to the plurality of anodes, respectively. The cathodes are located on the light-emitting material layers, respectively.

In the OLED display panel provided by an embodiment of the present application, a surface of the planarization layer is patterned with a plurality of grooves, and the plurality of anodes are filled in the grooves, respectively. An upper surface of the plurality of anodes is flush with an upper surface of the planarization layer.

In the OLED display panel provided by an embodiment of the present application, material of the plurality of reflecting electrodes is selected from a group consisting of silver, molybdenum and silver, and molybdenum-silver alloy.

In the OLED display panel provided by an embodiment of the present application, materials of the plurality of anodes from bottom to top are molybdenum, aluminum, and indium tin oxide.

In the OLED display panel provided by an embodiment of the present application, a thickness of the molybdenum is in a range from 14 nm to 20 nm; a thickness of the aluminum is in a range from 270 nm to 330 nm; and a thickness of the indium tin oxide is in a range from 12 nm to 18 nm.

An embodiment of the present application further provides a method of manufacturing organic light-emitting diode (OLED) display panel, comprising steps of:

S10: providing a thin-film transistor (TFT) device layer;

S20: manufacturing an insulating layer on the TFT device layer;

S30: manufacturing a plurality of reflecting electrodes on the insulating layer, wherein each of the reflecting electrodes corresponds to each emitting area of the OLED display panel;

S40: manufacturing a planarization layer on the insulating layer, wherein the planarization layer covers the plurality of reflecting electrodes;

S50: manufacturing a plurality of anodes on the planarization layer, wherein the plurality of anodes are positioned opposite to the plurality of reflecting electrodes;

S60: manufacturing a pixel defining layer on the planarization layer, wherein the pixel defining layer is formed with a plurality of pixel-disposition regions arranged in a matrix manner;

S70: manufacturing a plurality of light-emitting material layers at the plurality of pixel-disposition regions, respectively, wherein the light-emitting material layers are connected to the plurality of anodes, respectively; and S80: manufacturing a plurality of cathodes on a plurality of surfaces of the light-emitting material layers, respectively.

In the method of manufacturing OLED display panel provided by the embodiment of the present application, in the steps of s40 and s50, the method further comprises a step of patterning a surface of the planarization layer to form a plurality of grooves, wherein the plurality of anodes are filled in the grooves, respectively, and an upper surface of the plurality of anodes is flush with an upper surface of the planarization layer.

In the method of manufacturing OLED display panel provided by the embodiment of the present application, material of the plurality of reflecting electrodes is selected from a group consisting of silver, molybdenum and silver, and molybdenum-silver alloy.

In the method of manufacturing OLED display panel provided by the embodiment of the present application, materials of the plurality of anodes from bottom to top are molybdenum, aluminum, and indium tin oxide.

The present invention has the beneficial effects that an OLED display panel provided by an embodiment of the present application achieves the technical effect of improved reflectance by the joint effect of two reflection thin film layers between which a planarization layer is disposed, wherein an upper layer of the two reflection thin film layers is made of molybdenum, aluminum, and indium tin oxide to manufacture the anodes and a lower layer of the two reflection thin film layers is made of silver, molybdenum and silver, or molybdenum-silver alloy to manufacture the reflecting electrodes.

BRIEF DESCRIPTION OF THE DRAWINGS

In order to illustrate technical schemes of the present invention or the prior art more clearly, the following section briefly introduces drawings used to describe the embodiments and prior art. Obviously, the drawing in the following descriptions is merely some embodiments of the present invention. The ordinary person in the related art can acquire the other drawings according to these drawings without offering creative effort.

DETAILED DESCRIPTION OF EMBODIMENTS

Embodiments of the present invention are described clearly and completely with reference to the accompanying drawings as follows. Obviously, the described embodiments are part of embodiments of the present invention rather than all of them. Based on the embodiments of the present invention, all other embodiments obtained by a person skilled in the art without creativity efforts should be considered within the scope of protection of the disclosure.

In the process of manufacturing OLED display panels in the prior art, silver protrusions are prone to be formed since anodes are manufactured by using materials of silver and indium tin oxide resulting in short circuits of anodes and cathodes, forming dark spots, and low reflectance of other anode materials. The present embodiment is capable of solving the defect.

Figure 1:
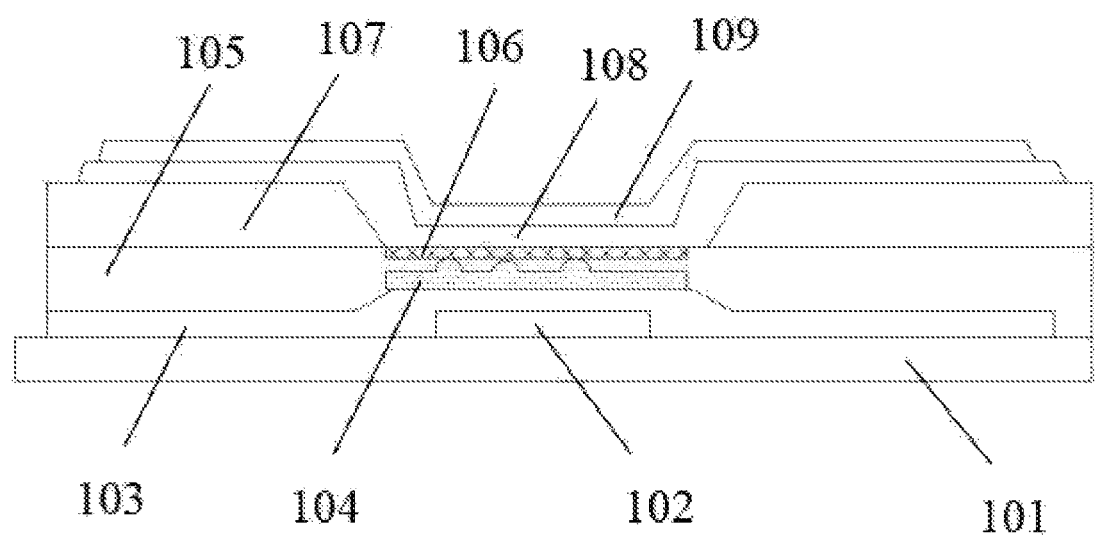
FIG. 1 is a schematic view of the structure of the OLED display panel provided by an embodiment of the present invention.

As shown in FIG. 1, which is a schematic view of the structure of the OLED display panel provided by an embodiment of the present invention, a partial structure of the OLED display panel of the present invention can be seen intuitively from the figure. The OLED display panel comprises a thin-film transistor (TFT) device layer and a light-emitting layer disposed on the thin-film transistor device layer, wherein the TFT device layer includes an OLED backplane 101 and data signal line same layer metal 102. A reflection-enhancing layer is further provided between the TFT device layer and the light-emitting layer. The reflection-enhancing layer includes an insulating layer 103 disposed on the TFT device layer, a plurality of reflecting electrodes 104 disposed on the insulating layer 103 in a matrix manner and corresponding one-to-one to each emitting area of the organic light-emitting diode display panel, and a planarization layer 105 disposed on the insulating layer 103 and covering the plurality of reflecting electrodes 104. A plurality of anodes 106 of the light-emitting layer are disposed on the planarization layer 105 in a matrix manner, and the plurality of anodes 106 of the light-emitting layer are positioned opposite to the plurality of reflecting electrodes 104.

The light-emitting layer further includes a pixel defining layer 107, a plurality of light-emitting material layers 108, and a plurality of cathodes 109. The pixel defining layer 107 is disposed on the planarization layer 105 and is formed with a plurality of pixel-disposition regions arranged in a matrix manner. The light-emitting material layers 108 are disposed at the plurality of pixel-disposition regions, respectively and are connected to the plurality of anodes 106, respectively. The cathodes 109 are located on the light-emitting material layers 108, respectively.

Specifically, a surface of the planarization layer is patterned with a plurality of grooves, and the plurality of anodes 106 are filled in the grooves, respectively, and an upper surface of the plurality of anodes 106 is flush with an upper surface of the planarization layer 105. The interval between the anodes 106 and the cathodes 109 is increased to avoid short circuits or other interference.

In the embodiment, material of the plurality of reflecting electrodes is selected from a group consisting of silver, molybdenum and silver, and molybdenum-silver alloy, wherein in the structure of the molybdenum and silver, the molybdenum is on the silver so as to protect the silver for preventing silver oxidation due to the last stage in the process. Materials of the plurality of anodes from bottom to top are molybdenum, aluminum, and indium tin oxide, wherein the function of the molybdenum at the bottom is to contact with metal layer and protect aluminum and the indium tin oxide at the top contacts with the hole transporting layer and matches the work function of the hole transporting layer.

A thickness of the molybdenum is in a range from 14 nm to 20 nm, a thickness of the aluminum is in a range from 270 nm to 330 nm, and a thickness of the indium tin oxide is in a range from 12 nm to 18 nm.

In this embodiment, the panel can still work normally in the case where the insulating layer 103 and the reflecting electrodes 104 are omitted. However, the reflectivity of the panel without the insulating layer 103 and the reflecting electrodes is lower than the panel shown in FIG. 1, but the technical problems of short circuits of the anodes and cathodes caused by the silver protrusion resulting in dark spot can be solved.

Figure 2:
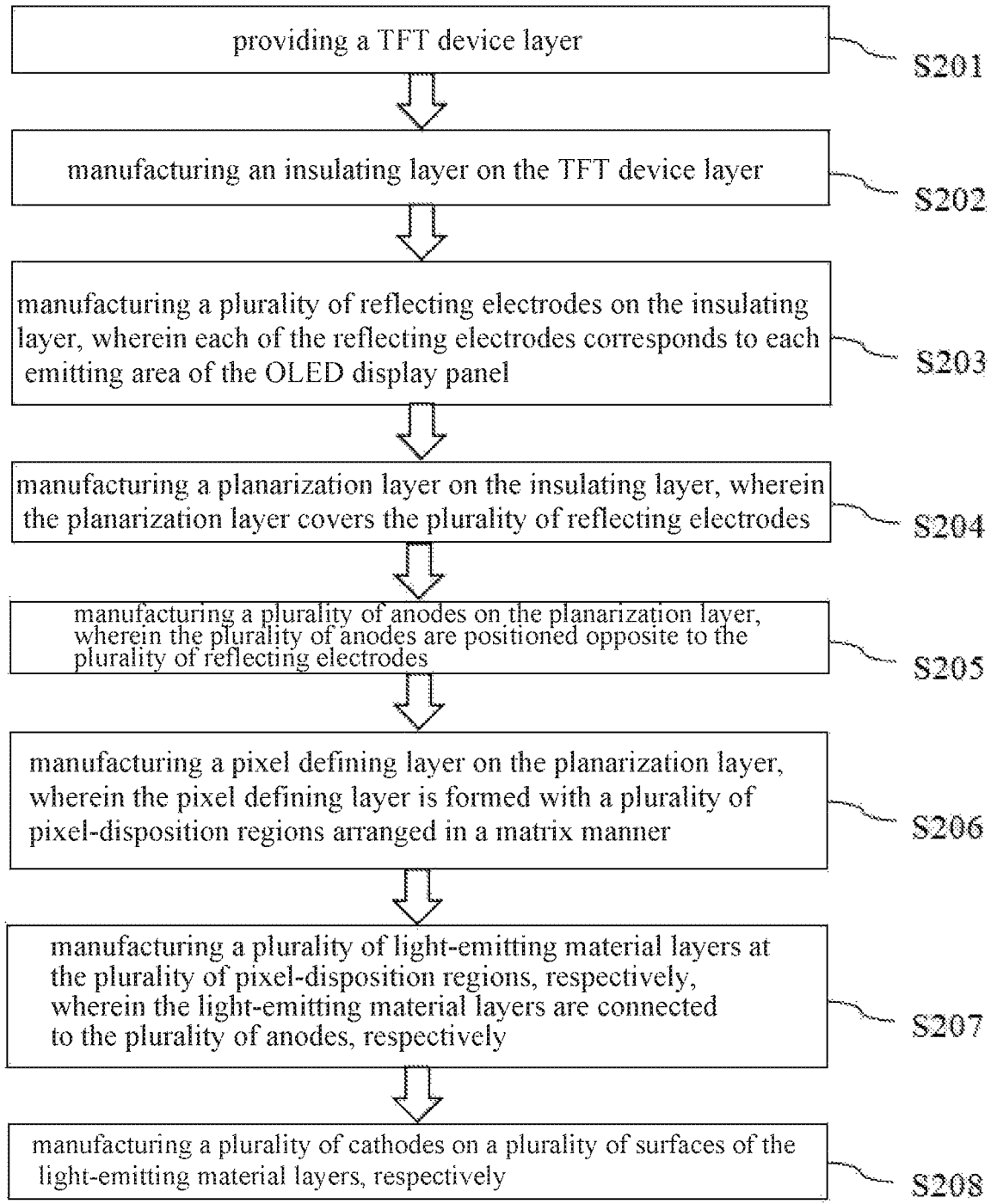
FIG. 2 is a flowchart of a method of manufacturing organic light-emitting diode (OLED) display panel provided by an embodiment of the present invention.
Figure 3A:
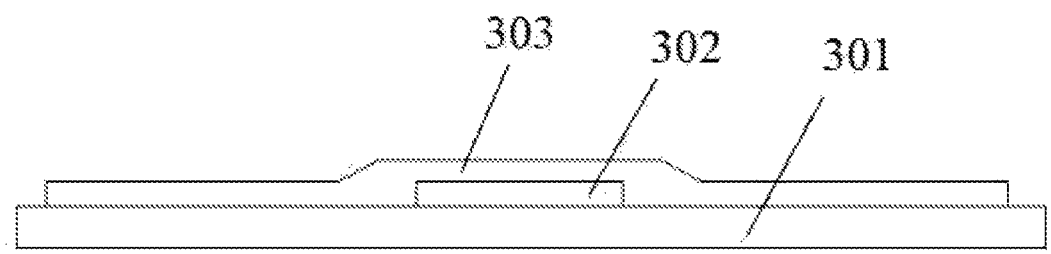
FIGS. 3a-3d are flowcharts of a method of manufacturing organic light-emitting diode (OLED) display panel provided by an embodiment of the present invention.
Figure 3B:
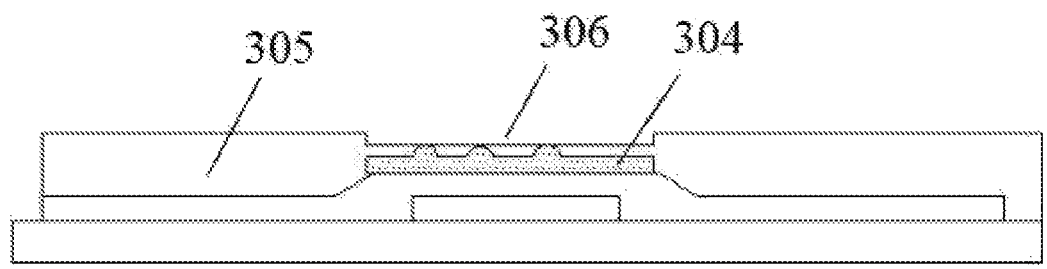
Figure 3C:
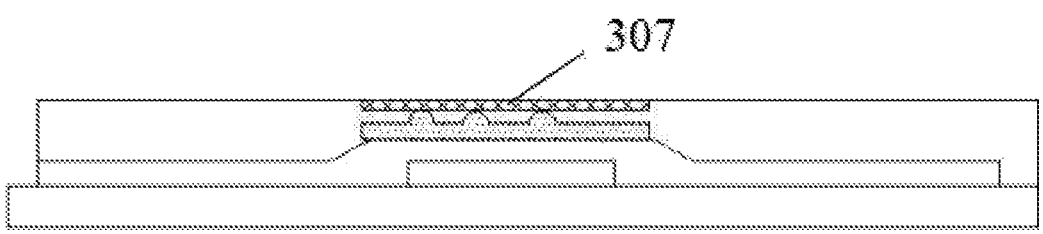
Figure 3D:
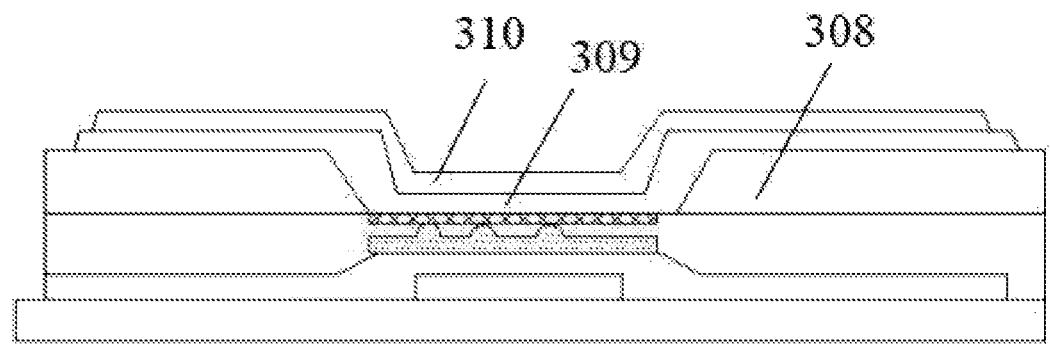

As shown in FIG. 2, which is a flowchart of a method of manufacturing an OLED display panel provided by an embodiment of the present invention, the method comprises steps of:

S201: providing a TFT device layer;

S202: manufacturing an insulating layer on the TFT device layer;

S203: manufacturing a plurality of reflecting electrodes on the insulating layer, wherein each of the reflecting electrodes corresponds to each emitting area of the OLED display panel;

S204: manufacturing a planarization layer on the insulating layer, wherein the planarization layer covers the plurality of reflecting electrodes;

S205: manufacturing a plurality of anodes on the planarization layer, wherein the plurality of anodes are positioned opposite to the plurality of reflecting electrodes;

S206: manufacturing a pixel defining layer on the planarization layer, wherein the pixel defining layer is formed with a plurality of pixel-disposition regions arranged in a matrix manner;

S207: manufacturing a plurality of light-emitting material layers at the plurality of pixel-disposition regions, respectively, wherein the light-emitting material layers are connected to the plurality of anodes, respectively; and S208: manufacturing a plurality of cathodes on a plurality of surfaces of the light-emitting material layers, respectively.

In the embodiment, in the steps of S204 and S205, the method further comprises a step of patterning a surface of the planarization layer to form a plurality of grooves, wherein the plurality of anodes are filled in the grooves, respectively, and an upper surface of the plurality of anodes is flush with an upper surface of the planarization layer.

In the embodiment, material of the plurality of reflecting electrodes is selected from a group consisting of silver, molybdenum and silver, and molybdenum-silver alloy. Materials of the plurality of anodes from bottom to top are molybdenum, aluminum, and indium tin oxide. A thickness of the molybdenum is in a range from 14 nm to 20 nm, a thickness of the aluminum is in a range from 270 nm to 330 nm, and a thickness of the indium tin oxide is in a range from 12 nm to 18 nm.

As shown in FIGS. 3a-3d, which are flowcharts of a method of manufacturing OLED display panel provided by an embodiment of the present invention, the process of manufacturing OLED display panel of the present invention can be seen intuitively from the figure. Firstly, an OLED TFT backplane 301 is provided, and data signal line same layer metal 302 is manufactured on the OLED TFT backplane 301, and an insulating layer 303 is manufactured on the OLED TFT backplane 301 for protecting the TFT device, wherein the data signal line same layer metal 302 can be the data signal line or electric capacity made of the data signal line same layer metal. Secondly, a plurality of reflecting electrodes 304 are manufactured on the insulating layer 303 by physical vapor deposition and lithography and etching process, wherein each of the reflecting electrodes 304 corresponds to each emitting area of the OLED display panel. A planarization layer 305 is manufactured by lithography process, and a surface of the planarization layer 305 is patterned with a plurality of grooves 306, and the plurality grooves 306 are positioned opposite to the plurality of reflecting electrodes 304. Thirdly, a plurality of anodes 307 are manufactured on the plurality grooves 306 respectively by physical vapor deposition and lithography and etching process, wherein the plurality of anodes 307 are filled in the grooves 306, respectively, and an upper surface of the plurality of anodes 307 is flush with an upper surface of the planarization layer 305. Lastly, manufacturing a pixel defining layer 308 and subsequent a plurality of light-emitting material layers 309 and a plurality of cathodes 310 on the panel mentioned above so that the manufacture of the OLED display panel is complete.

In this embodiment, material of the plurality of reflecting electrodes is selected from a group consisting of silver, molybdenum and silver, and molybdenum-silver alloy. Materials of the plurality of anodes from bottom to top are molybdenum, aluminum, and indium tin oxide. A thickness of the molybdenum is in a range from 14 nm to 20 nm, a thickness of the aluminum is in a range from 270 nm to 330 nm, and a thickness of the indium tin oxide is in a range from 12 nm to 18 nm.

In this embodiment, the panel can still work normally in the case where the insulating layer 303 and the reflecting electrodes 304 are omitted. However, the reflectivity of the panel without the insulating layer 303 and the reflecting electrodes 304 is lower than the panel shown in FIG. 1, but the technical problems of short circuits of the anodes and cathodes caused by the silver protrusion resulting in dark spot can be solved so that a shortened process and improved efficiency can be achieved.

As mentioned above, an OLED display panel provided by an embodiment of the present invention achieves the technical effect of improved reflectance by the joint effect of two reflection thin film layers between which a planarization layer is disposed, wherein an upper layer of the two reflection thin film layers is made of molybdenum, aluminum, and indium tin oxide to manufacture the anodes and a lower layer of the two reflection thin film layers is made of silver, molybdenum and silver, or molybdenum-silver alloy to manufacture the reflecting electrodes. Accordingly, the technical problems, in the OLED display panel in the prior art, regarding silver protrusions prone to be formed due to the use of materials of silver and indium tin oxide in manufacturing anodes resulting in short circuits of anodes and cathodes, forming dark spots, and low reflectance of other anode materials can be solved.

An OLED display panel and method for manufacturing the same provided by an embodiment of the present application have been described above in detail. It should be understood that the exemplary embodiments described herein are to be considered as illustrative to help understanding the methods and core concept of the present invention, and are not intended to limit the present invention.

What is claimed is:

1. An organic light-emitting diode (OLED) display panel, comprising a thin-film transistor (TFT) device layer and a light-emitting layer disposed on the thin-film transistor device layer, and a reflection-enhancing layer provided between the thin-film transistor device layer and the light-emitting layer, the reflection-enhancing layer including:

an insulating layer disposed on the thin-film transistor device layer;

a plurality of reflecting electrodes disposed on the insulating layer in a matrix manner and corresponding one-to-one to each emitting area of the organic light-emitting diode display panel; and a planarization layer disposed on the insulating layer and covering the plurality of reflecting electrodes;

wherein a plurality of anodes of the light-emitting layer are disposed on the planarization layer in a matrix manner, the plurality of anodes of the light-emitting layer are positioned opposite to the plurality of reflecting electrodes, a surface of the planarization layer is patterned with a plurality of grooves, the plurality of anodes are filled in the grooves, respectively, and an upper surface of the plurality of anodes is flush with an upper surface of the planarization layer.

2. The organic light-emitting diode (OLED) display panel according to claim 1, wherein the light-emitting layer further includes a pixel defining layer, a plurality of light-emitting material layers, and a plurality of cathodes; the pixel defining layer is disposed on the planarization layer and is formed with a plurality of pixel-disposition regions arranged in a matrix manner; the light-emitting material layers are disposed at the plurality of pixel-disposition regions, respectively and are connected to the plurality of anodes, respectively; and the cathodes are located on the light-emitting material layers, respectively.

3. The organic light-emitting diode (OLED) display panel according to claim 1, wherein material of the plurality of reflecting electrodes is selected from a group consisting of silver, molybdenum and silver, and molybdenum-silver alloy.

4. The organic light-emitting diode (OLED) display panel according to claim 1, wherein materials of the plurality of anodes from bottom to top are molybdenum, aluminum, and indium tin oxide.

5. The organic light-emitting diode (OLED) display panel according to claim 4, wherein a thickness of the molybdenum is in a range from 14 nm to 20 nm; a thickness of the aluminum is in a range from 270 nm to 330 nm; and a thickness of the indium tin oxide is in a range from 12 nm to 18 nm.

6. A method of manufacturing organic light-emitting diode (OLED) display panel, comprising steps of:
   S10: providing a thin-film transistor (TFT) device layer;
   S20: manufacturing an insulating layer on the thin-film transistor device layer;
   S30: manufacturing a plurality of reflecting electrodes on the insulating layer, wherein each of the reflecting electrodes corresponds to each emitting area of the OLED display panel;
   S40: manufacturing a planarization layer on the insulating layer, wherein the planarization layer covers the plurality of reflecting electrodes;
   S50: manufacturing a plurality of anodes on the planarization layer, wherein the plurality of anodes are positioned opposite to the plurality of reflecting electrodes;
   S60: manufacturing a pixel defining layer on the planarization layer, wherein the pixel defining layer is formed with a plurality of pixel-disposition regions arranged in a matrix manner;
   S70: manufacturing a plurality of light-emitting material layers at the plurality of pixel-disposition regions, respectively, wherein the light-emitting material layers are connected to the plurality of anodes, respectively; and
   S80: manufacturing a plurality of cathodes on a plurality of surfaces of the light-emitting material layers, respectively,
   wherein in the steps of S40 and S50, the method further comprises a step of patterning a surface of the planarization layer to form a plurality of grooves, wherein the plurality of anodes are filled in the grooves, respectively, and an upper surface of the plurality of anodes is flush with an upper surface of the planarization layer.

7. The method of manufacturing organic light-emitting diode (OLED) display panel according to claim 6, wherein material of the plurality of reflecting electrodes is selected from a group consisting of silver, molybdenum and silver, and molybdenum-silver alloy.

8. The method of manufacturing organic light-emitting diode (OLED) display panel according to claim 6, wherein materials of the plurality of anodes from bottom to top are molybdenum, aluminum, and indium tin oxide.

* * * * *